United States Patent
Audet et al.

(10) Patent No.: US 11,469,570 B2
(45) Date of Patent: Oct. 11, 2022

(54) INDEPENDENT CONTROL OF EMISSION WAVELENGTH AND OUTPUT POWER OF A SEMICONDUCTOR LASER

(71) Applicant: Apple Inc., Cupertino, CA (US)

(72) Inventors: Ross M. Audet, Menlo Park, CA (US); Mark Alan Arbore, Los Altos, CA (US); Alfredo Bismuto, San Jose, CA (US); Yves Bidaux, Neuchâtel (CH); Antoine Jean André Müller, Neuchâtel (CH)

(73) Assignee: Apple Inc., Cupertino, CA (US)

( * ) Notice: Subject to any disclaimer, the term of this patent is extended or adjusted under 35 U.S.C. 154(b) by 46 days.

(21) Appl. No.: 16/740,331

(22) Filed: Jan. 10, 2020

(65) Prior Publication Data

US 2020/0153202 A1 May 14, 2020

Related U.S. Application Data

(63) Continuation of application No. 16/282,176, filed on Feb. 21, 2019, now Pat. No. 10,535,979, which is a
(Continued)

(51) Int. Cl.
*H01S 5/0683* (2006.01)
*H01S 5/06* (2006.01)
(Continued)

(52) U.S. Cl.
CPC ............ *H01S 5/0683* (2013.01); *H01S 5/026* (2013.01); *H01S 5/02453* (2013.01);
(Continued)

(58) Field of Classification Search
CPC .... H01S 5/0683; H01S 5/02453; H01S 5/026; H01S 5/0607; H01S 5/141; H01S 5/0612;
(Continued)

(56) References Cited

U.S. PATENT DOCUMENTS

| | | |
|---|---|---|
| 4,896,325 A | 1/1990 | Coldren |
| 5,325,392 A | 6/1994 | Tohmori |

(Continued)

FOREIGN PATENT DOCUMENTS

| | | |
|---|---|---|
| EP | 1753104 | 2/2007 |
| EP | 2091118 | 8/2009 |

(Continued)

OTHER PUBLICATIONS

Lee, S.K. et al. (Apr. 1985). "A Multi-Touch Three Dimensional Touch-Sensitive Tablet," Proceedings of CHI: ACM Conference on Human Factors in Computing Systems, pp. 21-25.
(Continued)

*Primary Examiner* — Yuanda Zhang
(74) *Attorney, Agent, or Firm* — Brownstein Hyatt Farber Schreck, LLP

(57) ABSTRACT

Methods for driving a tunable laser with integrated tuning elements are disclosed. The methods can include modulating the tuning current and laser injection current such that the laser emission wavelength and output power are independently controllable. In some examples, the tuning current and laser injection current are modulated simultaneously and a wider tuning range can result. In some examples, one or both of these currents is sinusoidally modulated. In some examples, a constant output power can be achieved while tuning the emission wavelength. In some examples, the output power and tuning can follow a linear relationship. In some examples, injection current and tuning element drive waveforms necessary to achieve targeted output power and tuning waveforms can be achieved through optimization based on goodness of fit values between the targeted and actual output power and tuning waveforms.

18 Claims, 16 Drawing Sheets

Related U.S. Application Data continuation of application No. 15/555,049, filed as application No. PCT/US2016/021075 on Mar. 4, 2016, now abandoned.

(60) Provisional application No. 62/129,607, filed on Mar. 6, 2015.

(51) Int. Cl.
| | |
|---|---|
| *H01S 5/12* | (2021.01) |
| *H01S 5/125* | (2006.01) |
| *H01S 5/024* | (2006.01) |
| *H01S 5/026* | (2006.01) |
| *H01S 5/14* | (2006.01) |
| *H01S 5/0625* | (2006.01) |
| *H01S 5/0687* | (2006.01) |
| *H01S 5/227* | (2006.01) |
| *H01S 5/0234* | (2021.01) |

(52) U.S. Cl.
CPC .......... *H01S 5/0607* (2013.01); *H01S 5/0612* (2013.01); *H01S 5/12* (2013.01); *H01S 5/125* (2013.01); *H01S 5/141* (2013.01); *H01S 5/0234* (2021.01); *H01S 5/0261* (2013.01); *H01S 5/0687* (2013.01); *H01S 5/06256* (2013.01); *H01S 5/06832* (2013.01); *H01S 5/227* (2013.01)

(58) Field of Classification Search
CPC .......... H01S 5/12; H01S 5/125; H01S 5/0261; H01S 5/06256
See application file for complete search history.

(56) References Cited

U.S. PATENT DOCUMENTS

| | | |
|---|---|---|
| 5,341,391 A | 8/1994 | Ishimura |
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,345,135 B1 | 2/2002 | Reid |
| 6,647,032 B1 | 11/2003 | Lee et al. |
| 6,690,387 B2 | 2/2004 | Zimmerman et al. |
| 6,690,693 B1 | 2/2004 | Crowder |
| 6,788,719 B2 | 9/2004 | Crowder |
| 7,015,894 B2 | 3/2006 | Morohoshi |
| 7,106,778 B2 | 9/2006 | Reid |
| 7,130,325 B2 | 10/2006 | Oh et al. |
| 7,184,064 B2 | 2/2007 | Zimmerman et al. |
| 7,483,453 B2 | 1/2009 | Diffily et al. |
| 7,620,078 B2 | 11/2009 | Mori |
| 7,663,607 B2 | 2/2010 | Hotelling et al. |
| 7,903,704 B2 | 3/2011 | Patel et al. |
| 8,457,172 B2 | 6/2013 | Reid et al. |
| 8,479,122 B2 | 7/2013 | Hotelling et al. |
| 8,588,266 B2 | 11/2013 | Fujii |
| 8,774,243 B2 | 7/2014 | Kim et al. |
| 8,964,806 B2 | 2/2015 | Ensher et al. |
| 8,995,483 B2 | 3/2015 | Diehl et al. |
| 10,535,979 B2 | 1/2020 | Audet et al. |
| 2002/0181521 A1* | 12/2002 | Crowder ............... B82Y 20/00 372/38.02 |
| 2003/0161370 A1* | 8/2003 | Buimovich ........ H01S 5/06255 372/50.1 |
| 2004/0174915 A1 | 9/2004 | Sarlet et al. |
| 2006/0088068 A1* | 4/2006 | Farrell .................. H01S 5/0612 372/29.02 |
| 2006/0197753 A1 | 9/2006 | Hotelling |
| 2008/0063016 A1 | 3/2008 | Bhatia et al. |
| 2008/0159341 A1* | 7/2008 | Patel .................. G01N 21/1702 372/20 |
| 2013/0156052 A1* | 6/2013 | Diehl .................... H01S 5/0612 372/20 |
| 2014/0307753 A1 | 10/2014 | Minneman |
| 2018/0083421 A1 | 3/2018 | Audet et al. |
| 2018/0183207 A1 | 6/2018 | Audet et al. |

FOREIGN PATENT DOCUMENTS

| | | |
|---|---|---|
| EP | 2120301 | 11/2009 |
| EP | 2849294 | 3/2015 |
| GB | 2380058 | 3/2003 |
| JP | 04116878 | 4/1992 |
| JP | 2000163031 | 6/2000 |
| JP | 2002342033 | 11/2002 |
| JP | 2005175021 | 6/2005 |
| JP | 2010503987 | 2/2010 |
| JP | 2015115411 | 6/2015 |
| WO | WO 96/011416 | 4/1996 |
| WO | WO 08/033251 | 3/2008 |
| WO | WO 16/144831 | 9/2016 |
| WO | WO 16/176364 | 11/2016 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Tohmori, et al., "Broad-Range Wavelength-Tunable Superstructure Grating (SSG) DBR Lasers," IEEE Journal of Quantum Electronics, vol. 29, No. 6, Jun. 1993, pp. 1817-1823.

* cited by examiner

INDEPENDENT CONTROL OF EMISSION WAVELENGTH AND OUTPUT POWER OF A SEMICONDUCTOR LASER

CROSS REFERENCE TO RELATED APPLICATIONS

This application is a continuation of U.S. application Ser. No. 16/282,176, filed Feb. 21, 2019, which is a continuation of U.S. application Ser. No. 15/555,049, filed Aug. 31, 2017, now abandoned, which is a National Phase Patent Application under 35 U.S.C. § 371 of International Application No. PCT/US2016/021075, filed Mar. 4, 2016, which claims the benefit of U.S. Provisional Patent Application 62/129,607, filed Mar. 6, 2015, the contents of which are incorporated herein by reference as if fully disclosed herein.

FIELD

This relates generally to methods for driving a semiconductor laser, and more particularly to independently controlling emission wavelength and output power of the laser.

BACKGROUND

Semiconductor lasers are necessary for many applications, such as trace gas detection, environmental monitoring, biomedical diagnostics, telecommunications, and industrial process controls. These applications can benefit from tunable lasers with extremely narrow linewidths and single frequency emission.

To achieve narrow linewidths and wide tuning range, external cavity laser (ECL) systems, Distributed Bragg Reflector lasers, or Distributed Feedback lasers with integrated tuning elements can be employed. However, the performance of these systems and lasers can be limited by unwanted mechanical moving parts, slow response times, narrow tuning ranges, and nonlinear distortions in the laser output.

SUMMARY

This relates to methods for driving a tunable semiconductor laser with integrated tuning elements. The methods can include modulating the tuning current and laser injection current such that the laser emission wavelength and output power are independently controllable. In some examples, the tuning current and laser injection current are modulated simultaneously. In some examples, one of these currents or both is sinusoidally modulated. In some examples, a constant output power can be achieved while tuning the emission wavelength. In some examples, a larger tuning range can be achieved by examples of the disclosure compared to lasers whose tuning current and injection current are not modulated simultaneously. In some examples, the output power and tuning can follow a linear relationship. In some examples, injection current and tuning element drive waveforms necessary to achieve targeted output power and tuning waveforms can be achieved through optimization based on goodness of fit between the targeted and actual output power and tuning waveforms.

DETAILED DESCRIPTION

Figure 1:
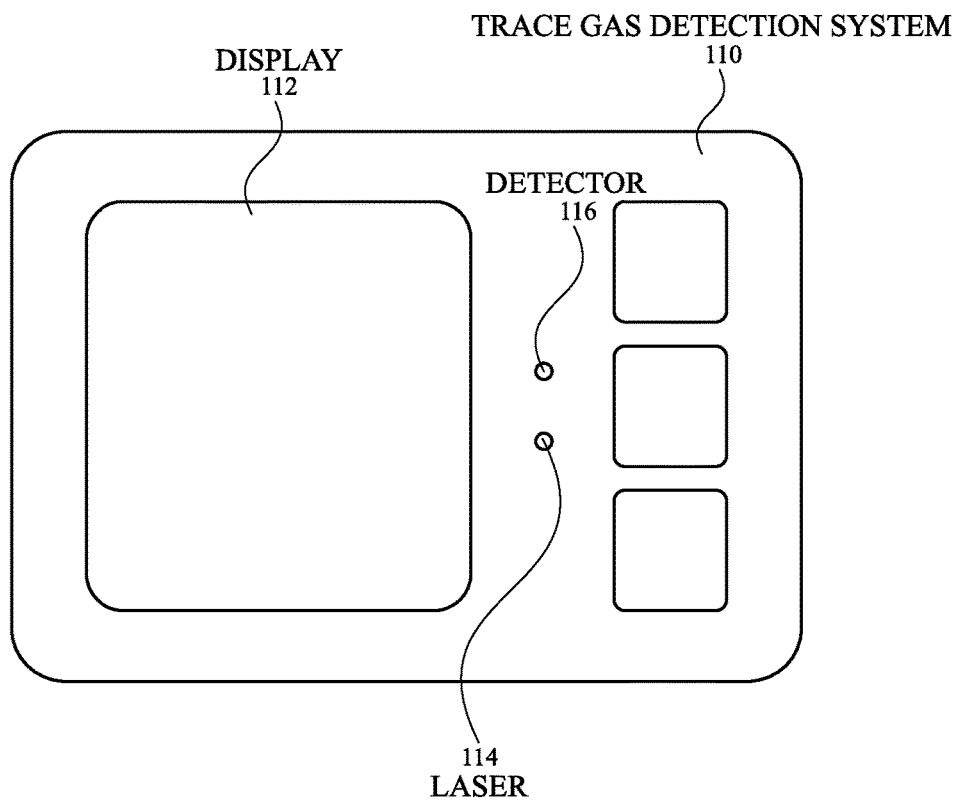
FIG. 1 illustrates an exemplary system in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

This disclosure relates to methods for driving a tunable laser with integrated tuning elements. The tuning current and laser injection current can be modulated such that the laser emission wavelength and output power are independently controllable. With independently controllable emission wavelength and output power, a wider tuning range (compared to a laser whose tuning current and injection current are not modulated simultaneously) can be achieved, and the laser can emit a substantially constant output power while the emission wavelength is tuned. Moreover, unwanted mechanical moving parts and compromise in the performance of the laser, such as slow response times and non-linear distortions, can be avoided or reduced.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

FIG. 1 illustrates an exemplary system in which examples of the disclosure can be implemented. Trace gas detection system 110 can include a display 112, laser 114, and detector 116. Laser 114 can be configurably operable using any of the methods and waveforms as will be disclosed.

Tunable semiconductor lasers are needed for many applications, such as trace gas detection, environmental monitoring, biomedical diagnostics, telecommunications, and industrial process controls. These applications, in particular, can benefit from tunable lasers with narrow or extremely narrow linewidths and single frequency emission.

Although typically used in large, bulky systems, tunable semiconductor lasers can have many uses in portable electronic devices. For example, wall-mountable trace gas detection system 110 can be located in a user's garage and can be used to detect if the exhaust from an automobile parked in the garage exceeds a safe level. The wall-mountable trace gas detection system 110 can provide a warning on display 112 and additionally transmit the information to a mobile telephone. In response, the mobile telephone can warn the user of the hazard and can prevent the user from entering the garage.

Figure 2A:
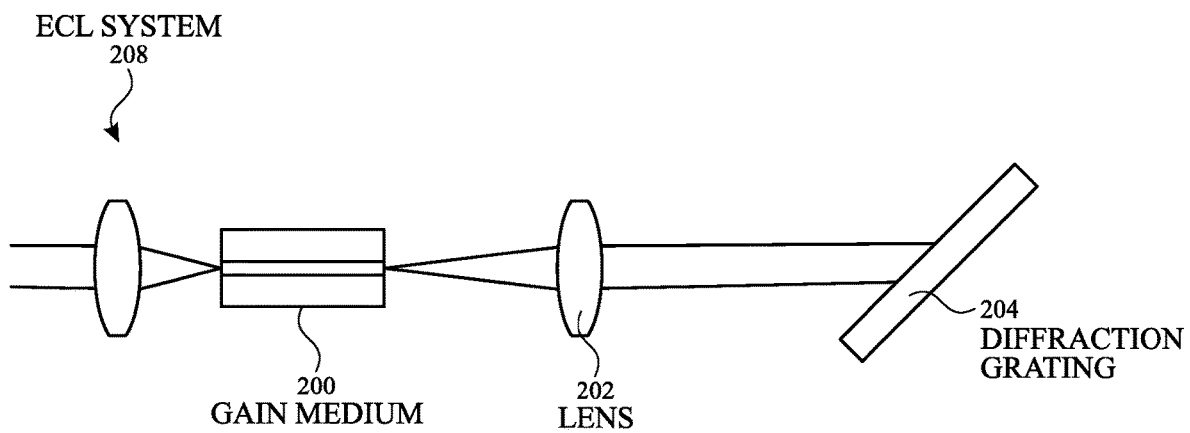
FIG. 2A illustrates a drawing of an external cavity laser system according to examples of the disclosure.

One way to achieve a wide tuning range is by using an external cavity laser (ECL) system. FIG. 2A illustrates a drawing of an external cavity laser system according to examples of the disclosure. The ECL system 208 can include a gain medium 200, lens 202, and diffraction grating 204. The emission wavelength of the ECL system 208 can be tuned by rotating the diffraction grating 204. Although the ECL system 208 can achieve a wide tuning range, the system can include macroscopic mechanical moving parts and thus can have limited tuning speed, can require precision alignment, can be susceptible to mechanical vibrations, and can have a tendency to exhibit mode hops. The external cavity laser architecture can be impractical for many of the applications discussed earlier, especially when used in portable electronic devices.

Another way to achieve a wide tuning range and narrow linewidths is by incorporating a periodic structure into the semiconductor laser. Two types of lasers with an incorporated period structure are Distributed Bragg Reflector (DBR) and Distributed Feedback (DFB) lasers.

Figure 2B:
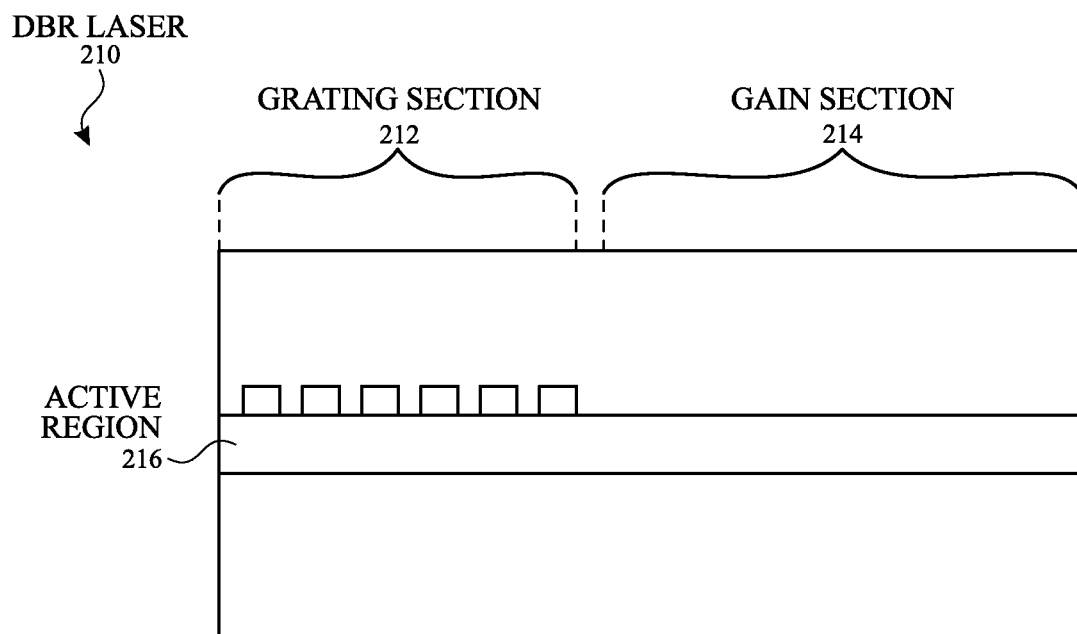
FIG. 2B illustrates a longitudinal view of an exemplary Distributed Bragg Reflector laser according to examples of the disclosure.

FIG. 2B illustrates a longitudinal view of an exemplary DBR laser according to examples of the disclosure. DBR laser 210 can comprise one or more diffraction gratings located in a grating section 212 that can be separate from the gain section 214. In some examples, DBR laser 210 can include grating sections, such as grating section 212, located at both ends of the device (not shown). The diffraction grating can be located on or above the active region 216 and can be employed to provide optical feedback to reflect light back into the cavity to form a resonator. The grating can be configured to reflect only narrow bands of wavelengths to produce a single longitudinal mode wavelength, and the period of the grating can be adjusted to achieve specific laser emission wavelengths.

Figure 2C:
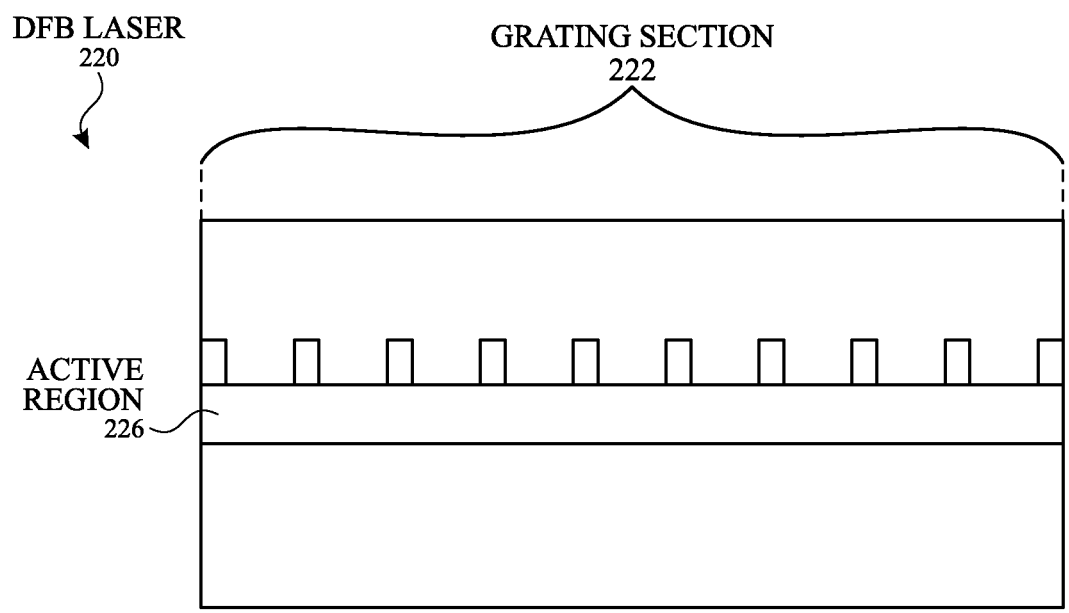
FIG. 2C illustrates a longitudinal view of an exemplary Distributed Feedback Laser according to examples of the disclosure.

FIG. 2C illustrates a longitudinal view of an exemplary DFB laser according to examples of the disclosure. DFB laser 220 can comprise a diffraction grating located in grating section 222, which can be integrated into or located on the active region 226. The structure and functionality of the diffraction grating of a DFB laser can be similar to that of a DBR laser. However, unlike DBR lasers where the grating section 212 is separate from the gain section 214, the DFB laser can have a gain section that coincides with the grating section. Since the gain section of the DFB laser can be located in the same region as the grating section 222, DFB lasers can have shorter cavity lengths. Additionally, DFB lasers can be less susceptible to mode hops.

Figure 3:
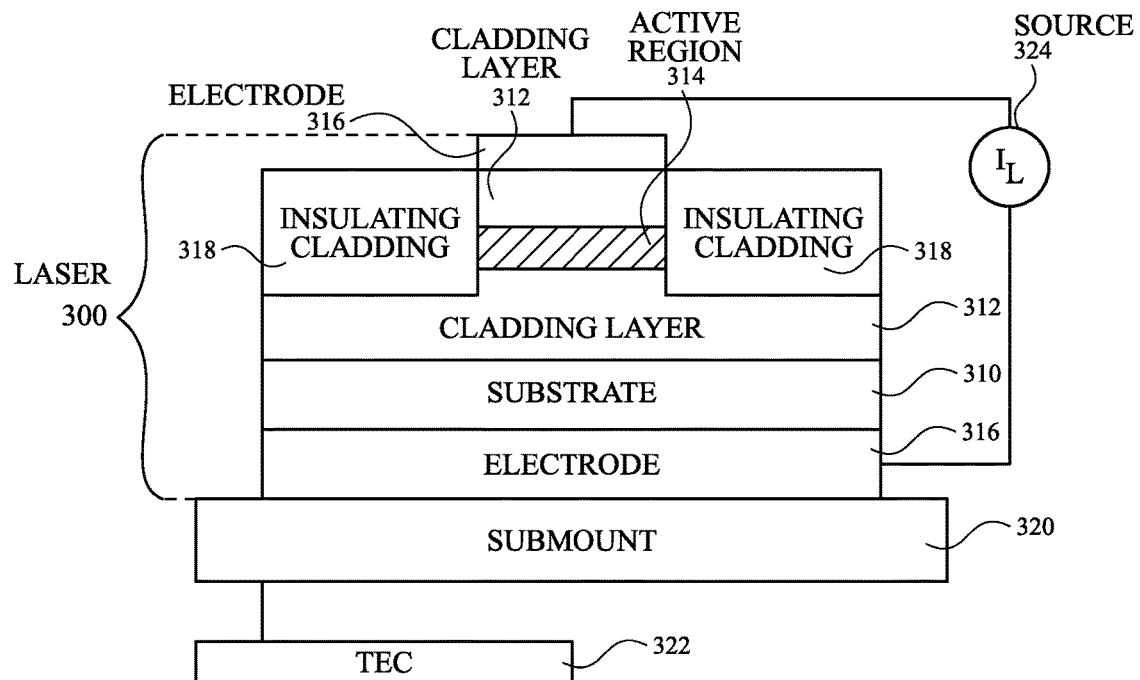
FIG. 3 illustrates a cross-sectional view of a laser according to examples of the disclosure.

FIG. 3 illustrates a cross-sectional view of a laser according to examples of the disclosure. Laser 300 can comprise a substrate 310, cladding layers 312, insulating cladding 318, active region 314, and electrodes 316. Laser 300 can be mounted to or touching submount 320. Laser 300 can be driven by a source 324 that supplies an injection current $I_L$, for example. To tune the emission wavelength of laser 300, the temperature of the active region 314 or the injection current $I_L$ can be adjusted. In some examples, the temperature can be adjusted to coarsely tune the emission wavelength, and the injection current $I_L$ can be adjusted for more precise tuning.

To adjust the temperature of the active region 314, a thermo-electric cooler (TEC) 322 can apply heat to submount 320. The heat can pass through the electrode 316, substrate 310, and cladding layer 312 to active region 314, which can cause a change in the refractive index of the grating (located on or above active region 314). The change in refractive index can lead to a change in the emission wavelength. Therefore, the emission wavelength of laser 300 can be tuned by changing the heat applied through TEC 322. However, there can be a few problems with tuning through applied heat. Heating the laser may require a lot of power from TEC 322. Requiring a lot of power may not be practical for certain devices, such as portable electronic devices, which have stringent power constraints due to portability and size requirements. Additionally, heating the laser 300 using TEC 322 can lead to a slow response resulting in slow tuning speeds, as TEC 322 may need to cool and heat the laser 300, submount 320, and heat sink (not shown). Accordingly, the time delay between applying the heat and achieving the targeted emission wavelength can be on the order of seconds, and many applications may need quicker adjustment of the laser emission wavelength.

Another method of tuning laser 300 can be through the injection current IL. Injection current IL can be used to drive the laser through electrodes 316. Similar to using TEC 322, the injection current IL can heat up the active region 314 resulting in a change in the emission wavelength. While tuning using the injection current may provide a finer adjustment in wavelength, the tuning range can be limited when using this method because the laser efficiency may decrease at the high injection currents necessary to substantially increase the temperature. For example, the tuning range can be on the order of about 0.2% from the nominal wavelength. For a 9 μm laser, this can lead to a tuning range of only 0.036 microns, which may be insufficient for applications such as spectroscopy. Furthermore, independent control of the laser output power and the emission wavelength may not be possible, since both the output power and emission wavelength can be influenced by the injection current.

Figure 4A:
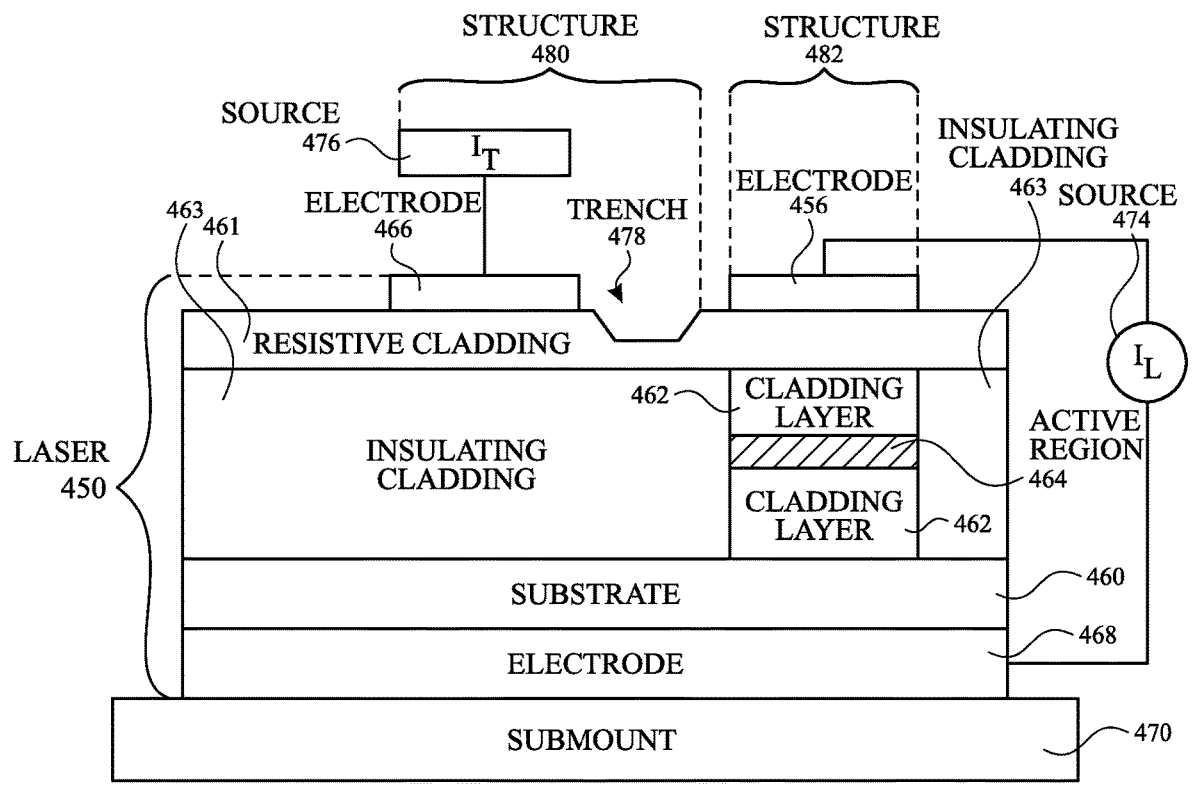
FIG. 4A illustrates an exemplary laser with an integrated tuning element according to examples of the disclosure.

One way to overcome the problems encountered when tuning through a TEC or through the injection current can be to use integrated tuning elements. FIG. 4A illustrates an exemplary laser with an integrated tuning element according to examples of the disclosure. Laser 450 can comprise a substrate 460, cladding layers 462, insulated cladding 463, active region 464, electrodes 456, 466, and 468, and resistive cladding 461. Laser 450 can comprise two separate structures 480 and 482. Structure 480 can be a tuning element, and structure 482 can be a laser structure, for example. A source 474 can be connected to the top and bottom electrodes 456 and 468 of the laser structure 482 to provide an injection current $I_L$ to drive the laser 450. Tuning element or structure 480 can be an electrically contacted structure that is in close proximity to structure 482. Source 476 can be connected to the top electrode 466 to provide tuning current $I_T$ to drive the tuning element or structure 480. In one embodiment, trench 478 forms an electrical resistor that generates heat when current is provided by source 476. While FIG. 4A shows sources 474 and 476 as current sources, one skilled in the art would understand that any type of source can be connected. Examples of the disclosure can include, but are not limited to, source 476 altering the modal refractive index of the laser waveguide through heating, plasma dispersion effects, electro-optic effects, or a combination.

Source 474 can drive the laser through injection current $I_L$ to achieve a targeted output power, and source 476 can adjust the temperature of the active region 464 through tuning current $I_T$ to achieve a targeted emission wavelength. However, adjusting the injection current $I_L$ can affect the temperature of the active region 464, and adjusting the tuning current $I_T$ can affect the gain of the laser 450. Since the injection current $I_L$ and the tuning current $I_T$ are not entirely decoupled, adjusting the injection current $I_L$ and adjusting the tuning current $I_T$ can have limited flexibility in optimizing the emission wavelength without negatively affecting the optical losses or electrical properties of the laser.

Figure 4B:
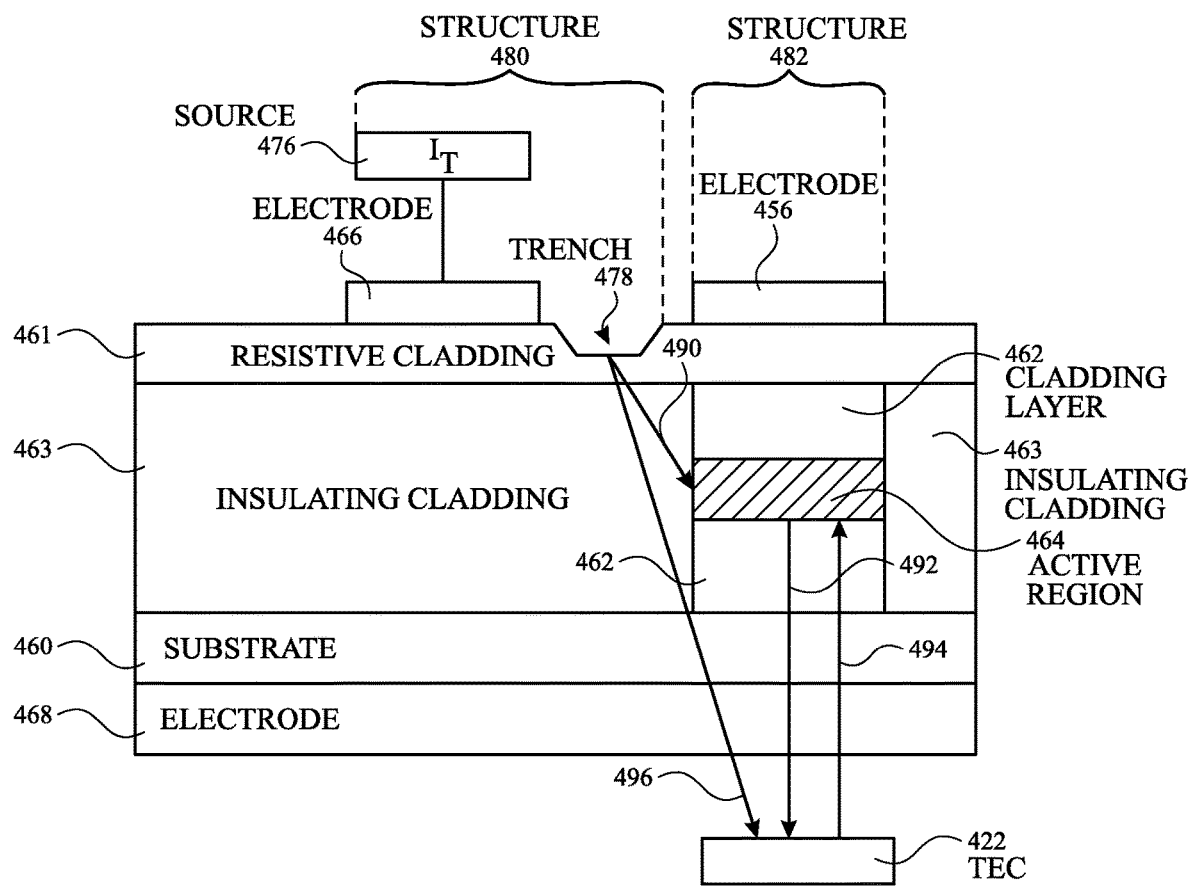
FIG. 4B illustrates exemplary heat-related time delays for a laser with an integrated tuning element according to examples of the disclosure.
Figure 4C:
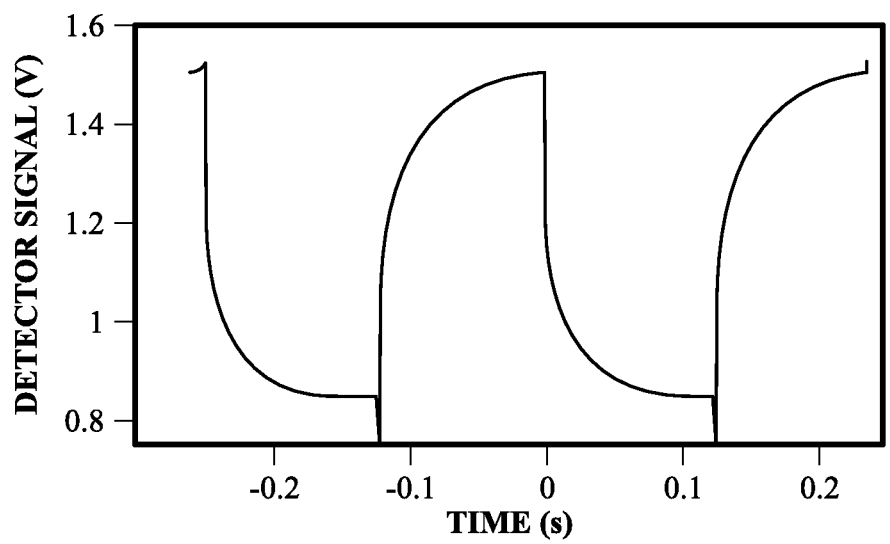
FIG. 4C illustrates an exemplary plot of the optical output power in response to a square wave driven on the tuning element electrode, with asymmetry in rise and fall times due to the differences in heat-related time delays according to examples of the disclosure.

The laser can also include multiple heat-related time delays, as shown in FIG. 4B. Path 490 and 496 can be associated with heat induced by the tuning element current or source 476. Paths 492 and 494 can be associated with heating or cooling induced by TEC 422. Heat along path 490 can diffuse from the tuning element to the active region 464 in the laser structure, leading to a time delay that can be on the order of hundreds of μs. Heat along path 496 can diffuse through insulating cladding 463, substrate 460, and electrode 468 to TEC 422. Heat along path 494 can diffuse from the submount (not shown) and substrate 460 to the active region 464 to heat the laser ridge, and heat along path 492 can diffuse from the laser ridge to the substrate 460 and submount to cool the laser ridge. The time delays from paths 492 and 494 can be about 1-100 ms. Due to the large difference between the time delays of path 490 and path 492/494, the use of source 476 and 474 along with TEC 422 can lead to nonlinear distortions and long response times. FIG. 4C illustrates an exemplary plot of the output power response to a square wave modulation of the tuning element source 476 due to the differences in heat-related time delays according to examples of the disclosure.

Figure 5A:
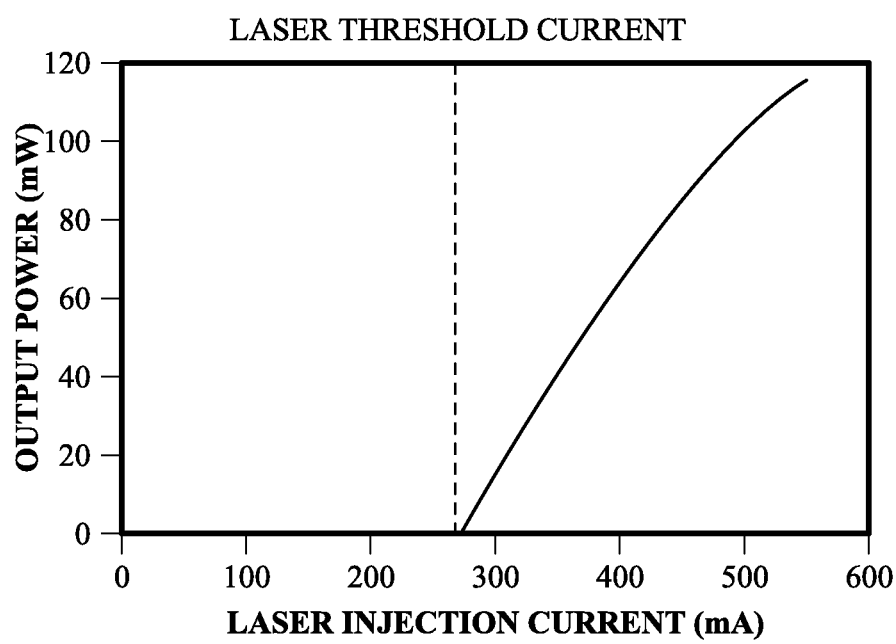
FIG. 5A illustrates an exemplary relationship between laser injection current and laser output power according to examples of the disclosure.
Figure 5B:
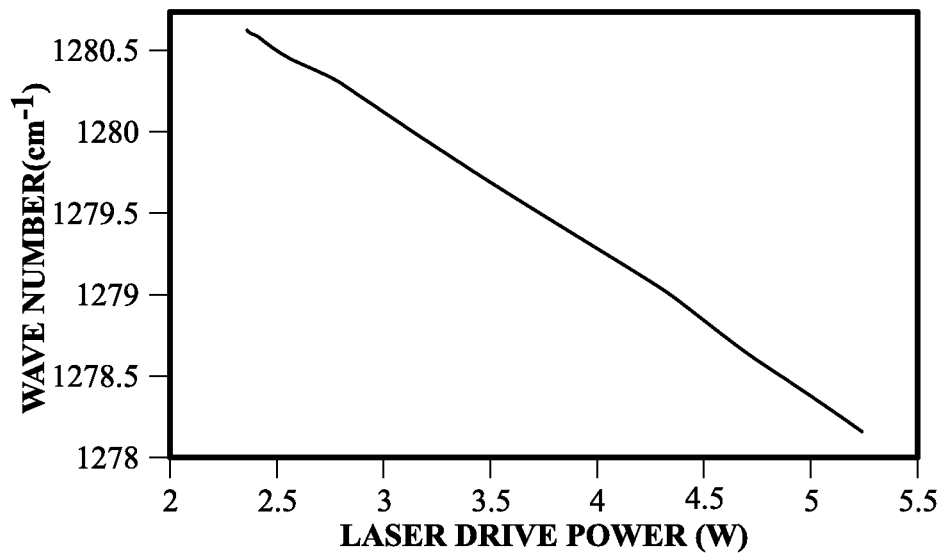
FIG. 5B illustrates an exemplary relationship between laser drive power and emission wavelength or wavenumber according to examples of the disclosure.
Figure 5C:
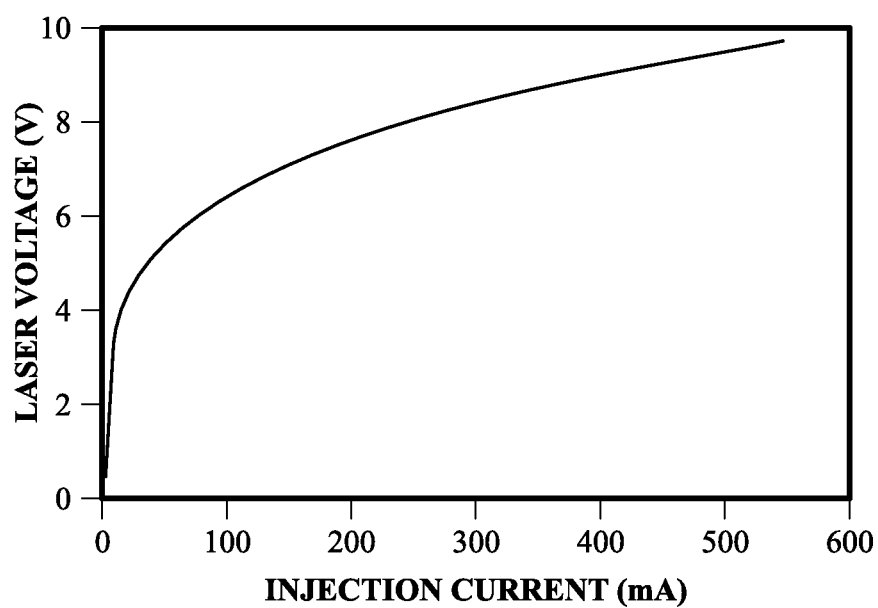
FIG. 5C illustrates an exemplary relationship between injection current and laser voltage according to examples of the disclosure.

FIGS. 5A-5C illustrate exemplary effects of altering the injection current applied to the laser according to examples of the disclosure. FIG. 5A illustrates an exemplary relationship between laser injection current and laser output power according to examples of the disclosure. For a constant submount temperature, the laser output power can be linearly dependent on the injection current above the laser threshold current. The slope efficiency of the laser can be determined based on this linear dependency. At high injection currents, this linear dependence can break down due to an increase in the temperature of the active region causing a decrease in internal quantum efficiency, which in turn can cause the output power to saturate (i.e., thermal rollover).

FIG. 5B illustrates an exemplary relationship between laser drive power and emission wavelength or wavenumber according to examples of the disclosure. For a constant submount temperature, the emission wavelength or wavenumber can be linearly dependent on the laser drive power. As shown, the emission wavelength can redshift with increased drive power. As discussed above, a change in temperature of the active region can lead to a change in the refractive index, and therefore a change in the emission wavelength.

FIG. 5C illustrates an exemplary relationship between injection current and laser voltage according to examples of the disclosure. The shift in emission wavelength that results from thermal tuning can be proportional to the power dissipation inside the laser, which can be related to the product of the voltage and current. Due to the relationship between injection current and laser voltage illustrated in the figure, the emission wavelength may not be directly proportional to the injection current.

Figure 5D:
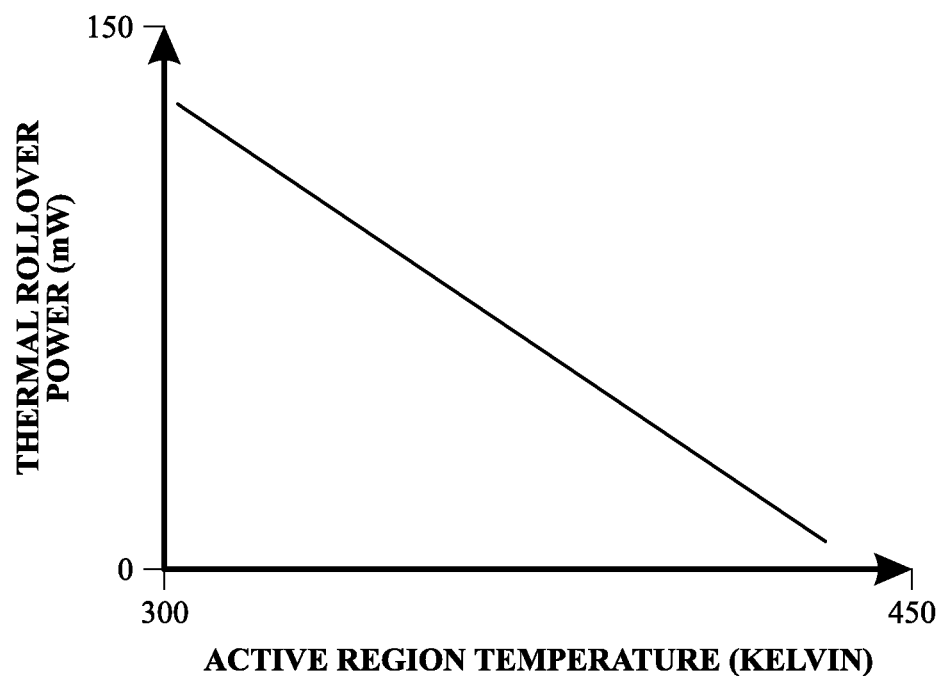
FIG. 5D illustrates an exemplary relationship between the temperature of the active region and the thermal rollover power according to examples of the disclosure.

FIG. 5D illustrates an exemplary relationship between the temperature of the active region and the thermal rollover power according to examples of the disclosure. As discussed above, while increasing the injection current can lead to a higher output power, the temperature of the active region can increase. Above a certain injection current, the temperature of the active region can be so high that a reduction in the efficiency of the laser and a deviation from the linear dependency (or slope of the plot illustrated in FIG. 5A) can result. The output power can saturate to a maximum output power (i.e., thermal rollover power or where the derivative of power to injection current is zero) within the safe operating range of the laser. The maximum output power or thermal rollover power can depend on many factors including, but not limited to, the heatsink or substrate temperature, the tuning or heater current, device length, and device design. The thermal rollover power can decrease as the temperature of the active region increases, as shown in the figure. As a result, the thermal rollover power can vary for the same laser device depending on operating conditions.

Figure 5E:
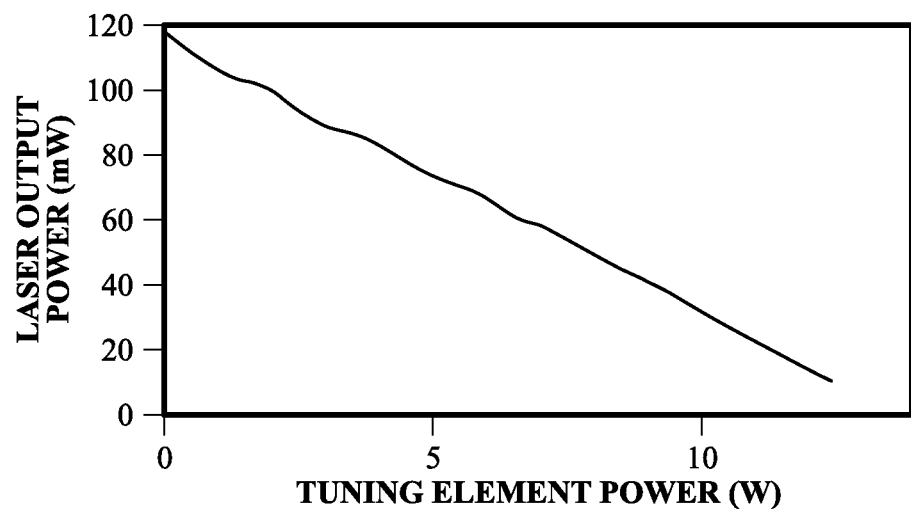
FIG. 5E illustrates an exemplary relationship between tuning element power and laser output power according to examples of the disclosure.
Figure 5F:
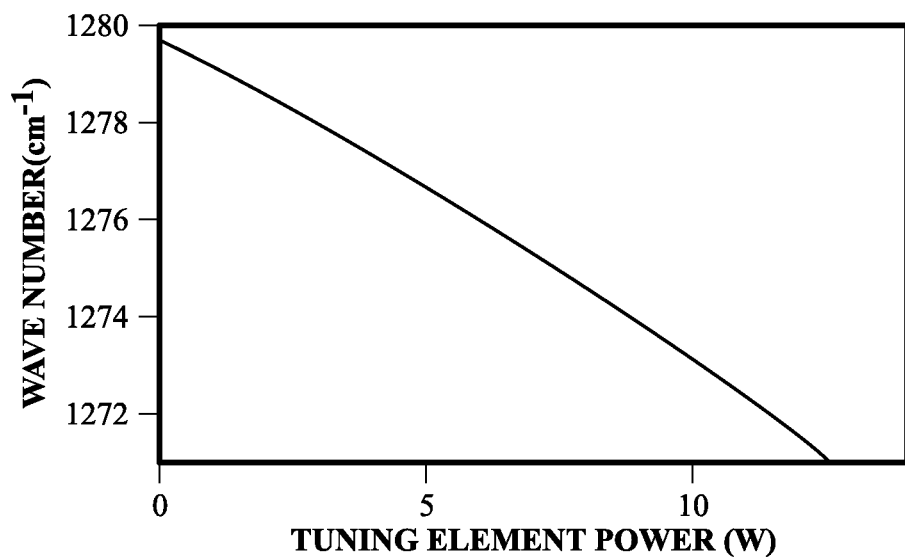
FIG. 5F illustrates an exemplary relationship between tuning element power and emission wavelength or wavenumber according to examples of the disclosure.
Figure 5G:
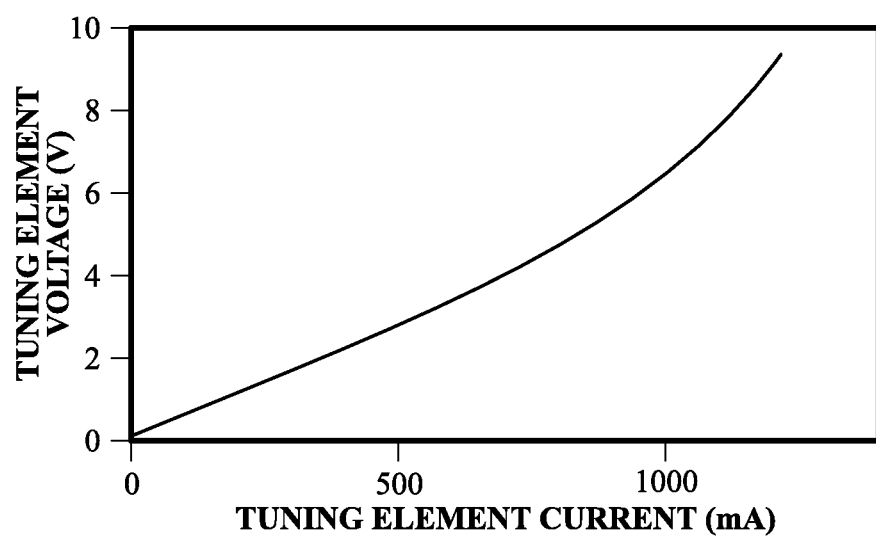
FIG. 5G illustrates an exemplary relationship between tuning element drive current and tuning element voltage according to examples of the disclosure.

FIGS. 5E-5G illustrate exemplary effects of altering the tuning element of the laser according to examples of the disclosure. FIG. 5E illustrates an exemplary relationship between tuning element power and laser output power according to examples of the disclosure. For a constant laser injection current, the laser output power can be linearly dependent on the tuning element power. As shown in the figure, the laser output power can decrease as tuning power is increased.

FIG. 5F illustrates an exemplary relationship between tuning element power and emission wavelength or wavenumber according to examples of the disclosure. For constant laser injection current, the emission wavelength can be nearly linear dependent on the tuning element drive power. As shown in the figure, the laser output power can decrease as tuning element drive power increases.

FIG. 5G illustrates an exemplary relationship between tuning element drive current and tuning element voltage according to examples of the disclosure. The IV curve of the tuning element may become nonlinear at high tuning element currents. This nonlinear relationship can cause the laser output power and emission wavelength to diverge from having a known relationship (e.g., quadratic dependence) with respect to the tuning element current. Due to divergence from a known relationship and because of the coupling between the injection current and tuning element current with emission wavelength and output power, simultaneous optimization of the emission wavelength and output power can become a challenge. Additionally, the performance of the laser (e.g., tuning range and output power) can be limited.

Figure 6:
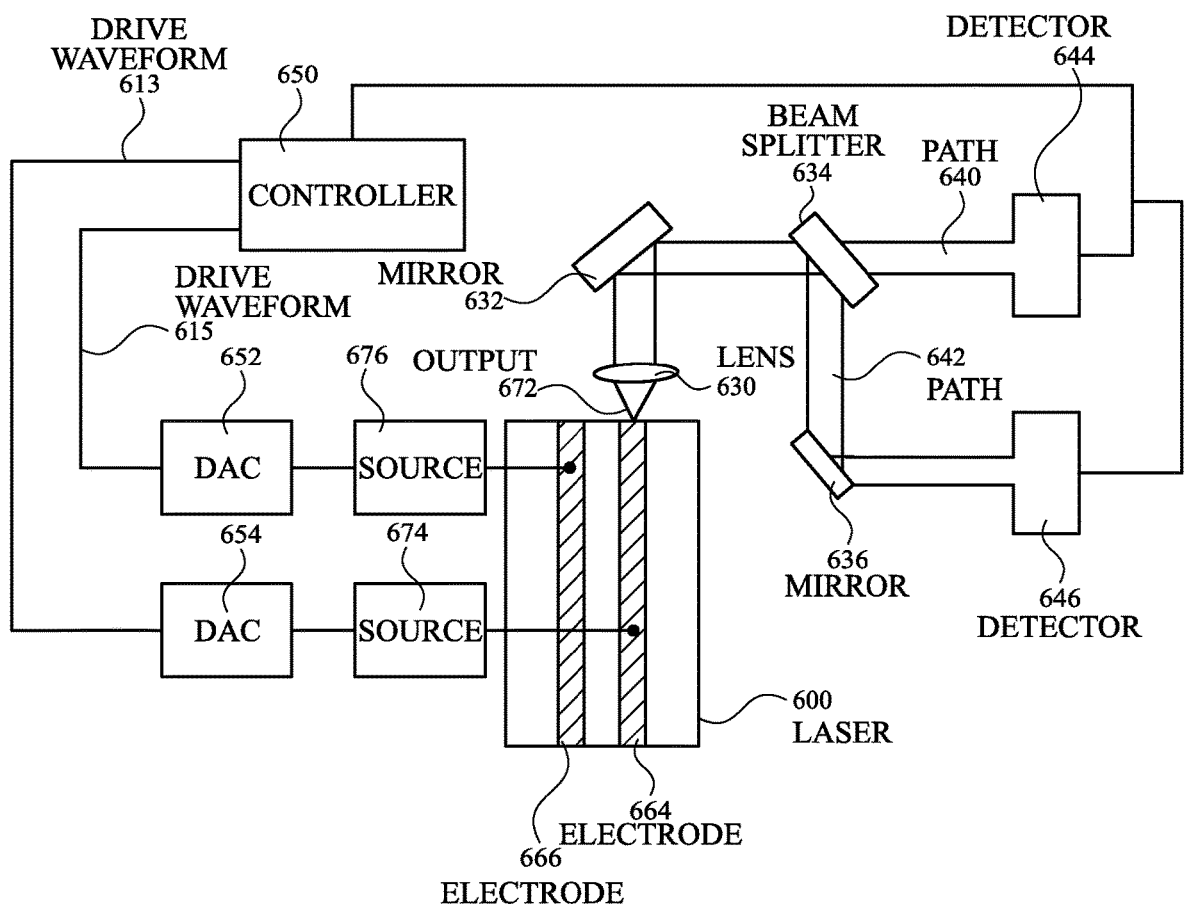
FIG. 6 illustrates an exemplary setup for simultaneous modulation and dynamic adjustment of the emission wavelength and output power from a laser according to examples of the disclosure.

FIG. 6 illustrates a setup for simultaneous modulation and dynamic adjustment of the emission wavelength and output power of a laser according to examples of the disclosure. The setup can include a laser 600. Laser 600 can include, but is not limited to, a DFB or DBR semiconductor laser, such as a quantum cascade laser (QCL), interband cascade laser (ICL), or type-I laser. In some examples, the laser can operate in several wavelength ranges including the near- and mid-infrared. Laser 600 can include two separate electrodes 664 and 666. One electrode, such as electrode 664, can be coupled to the tuning element (such as structure 480 illustrated in FIG. 4A). The other electrode, such as electrode 666, can be coupled to the laser structure (such as structure 482 illustrated in FIG. 4A).

Two sources can be coupled to the electrodes to independently drive the electrodes. For example, source 676 can be coupled to electrode 666 of the tuning element, and source 674 can be coupled to electrode 664 of the laser. The output 672 of laser 600 can be directed at lens 630, which can reflect off mirror 632. Beamsplitter 634 can split the optical beam into two different paths 640 and 642. Path 640 can be directed at detector 644. Path 642 can be directed at mirror 636, which can reflect the light to detector 646. Detector 644 can measure the laser output power, and detector 646 can measure emission wavelength. In some examples, an etalon can be included in path 642 between mirror 636 and detector 646. In some examples, an optical spectrometer can be used to measure emission wavelength. The detected signals from detectors 644 and 646 can be input to a computer or controller 650.

The controller 650 can monitor deviations between the detected signals and the targeted signals or response waveform. Based on the deviations, the controller 650 can generate drive waveforms 613 and 615. Drive waveforms 613 and 615 can be new waveforms or adjusted waveforms used to minimize or reduce the deviations. Digital-to-analog converters (DACs) 652 and 654 can be coupled to controller 650 and sources 674 and 676 to convert the signals or waveforms generated by controller 650 from digital to analog signals.

Figure 7A:
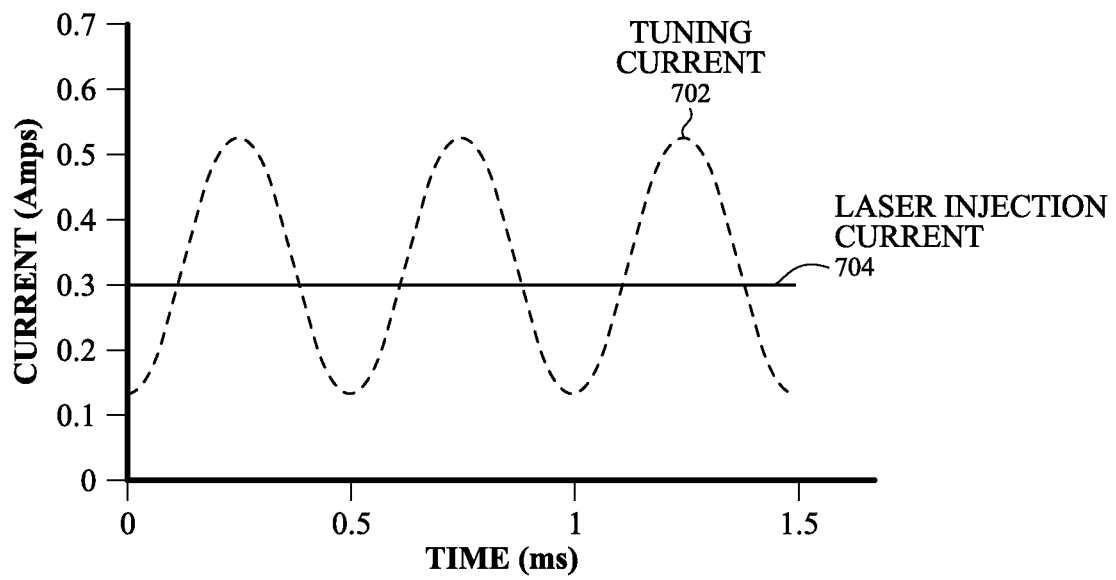
FIG. 7A illustrates an exemplary sinusoidally modulated drive waveform applied to the tuning element and a constant drive waveform applied to the waveguide of a laser according to examples of the disclosure.
Figure 7B:
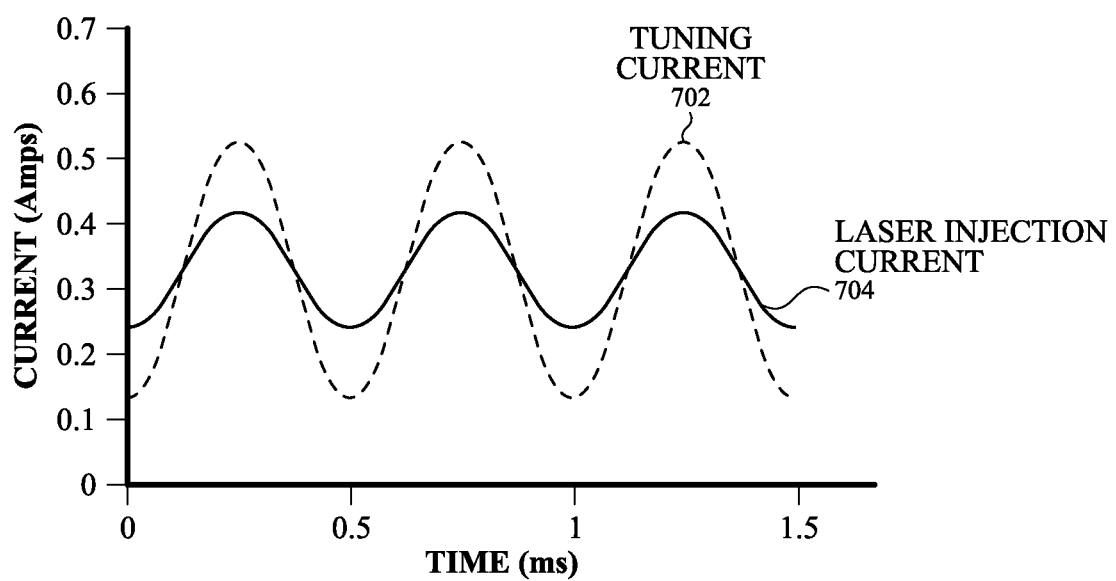
FIG. 7B illustrates exemplary sinusoidally modulated drive waveforms applied to the electrodes of a laser according to examples of the disclosure.
Figure 7C:
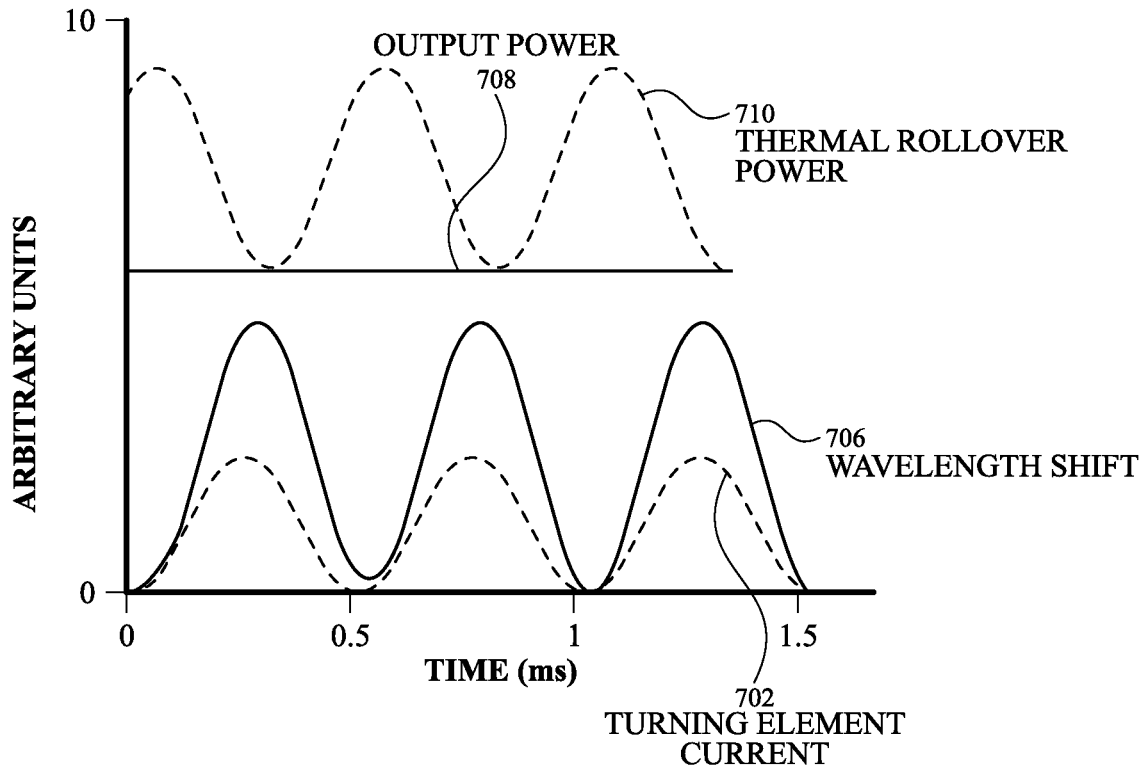
FIG. 7C illustrates exemplary sinusoidally varying wavelength shift and constant output power below a thermal rollover power from a laser according to examples of the disclosure.
Figure 7D:
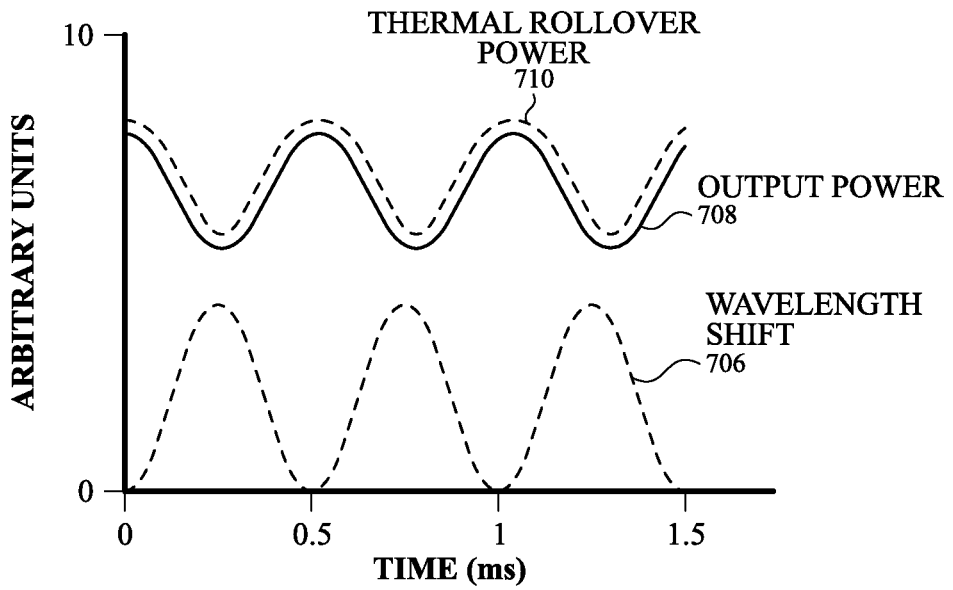
FIG. 7D illustrates exemplary sinusoidally varying wavelength shift and output power at or near a thermal rollover power from a laser according to examples of the disclosure.
Figure 7E:
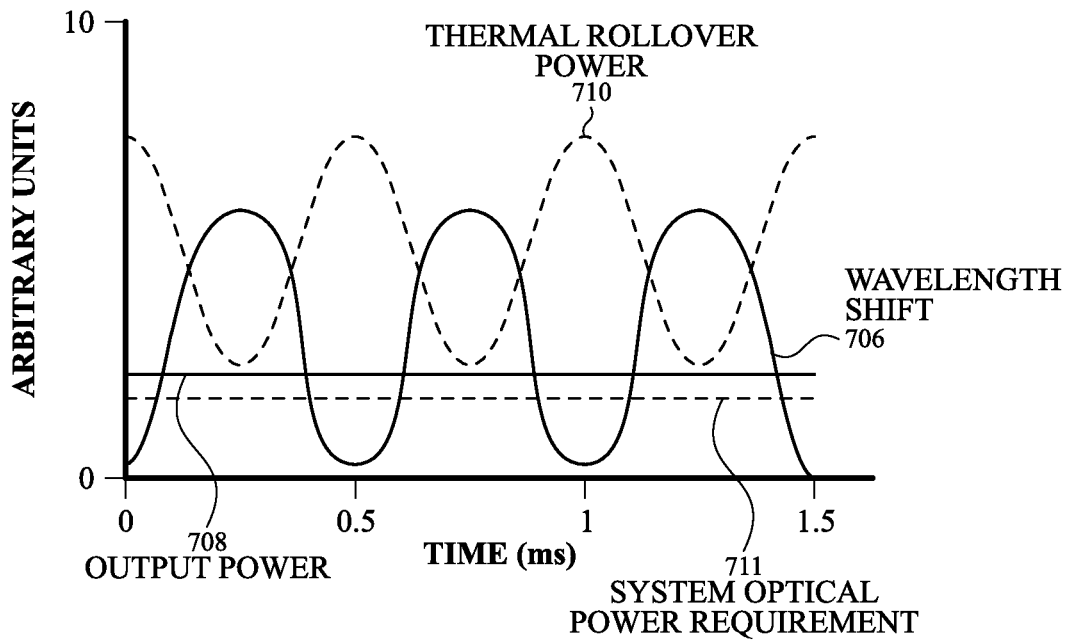
FIG. 7E illustrates exemplary sinusoidally varying wavelength shift and constant output power equal to a system requirement value according to examples of the disclosure.
Figure 7F:
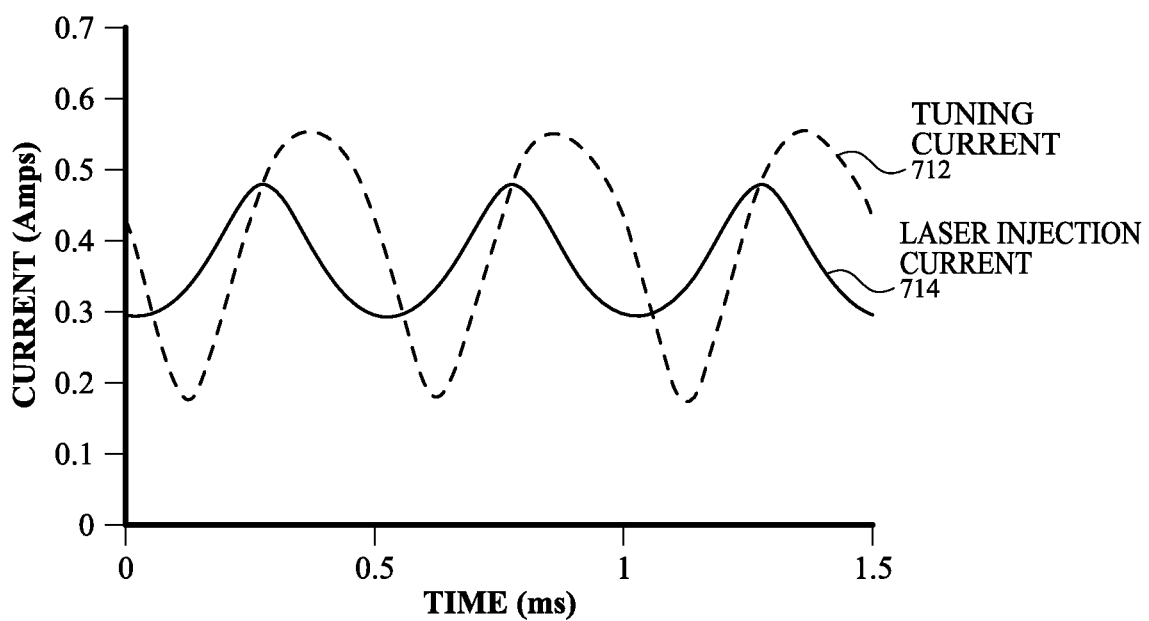
FIG. 7F illustrates exemplary non-sinusoidally modulated drive waveforms applied to the electrodes of the laser according to examples of the disclosure.

FIGS. 7A-7B and 7F illustrate exemplary drive waveforms applied to the electrodes of a laser according to examples of the disclosure. FIGS. 7C-7E, 7G-7I illustrate exemplary output waveforms of the laser according to examples of the disclosure. As shown in FIG. 7A, the tuning current 702 can be sinusoidally modulated, while the laser injection current 704 can be constant. In some examples, both the tuning current 702 and laser injection current 704 can be sinusoidally modulated (as shown in FIG. 7B). In some examples, the laser injection current 704 can be proportional to the square root of the sine of the modulating tuning current 702.

Exemplary resulting output waveforms are shown in FIG. 7C, where the wavelength shift 706 of the laser can vary sinusoidally. Additionally, the laser can emit a constant or substantially constant output power 708. This example shows that a substantially constant output power can be achieved while tuning the wavelength. With the injection current greater than the threshold current, the output power can be less than the thermal rollover power for a given tuning range or range of wavelength shift. As a result, the output power can be varied (increased or decreased) to achieve a desired tuning range. Achieving a constant output power while tuning the wavelength can be useful for applications such as wavelength modulation spectroscopy.

FIG. 7D illustrates exemplary waveforms where the laser can be operated such that the output power is close to the thermal rollover power according to examples of the disclosure. The laser can be operated with an output power where the output power to current slope begins to deviate from a linear relationship (i.e., close to the thermal rollover power). In some examples, the laser can be operated such that the output power is substantially equal to the thermal rollover power, leading to a decreased tuning range compared to when the output power 708 is substantially less than the thermal rollover power 710. In some examples, the laser can be operated with an output power between deviation from the linear relationship and the thermal rollover power (i.e., power where the derivative of the output power to current is zero). Examples of the disclosure include adjusting the operating conditions of the laser such that derivative of the output power to current is zero given the active region temperature. Operating the laser such that the output power 708 is substantially equal or close to the thermal rollover power 710 can be useful for applications such as wavelength modulation spectroscopy measurements that are normalized to a reference detector.

In some examples, a larger tuning range can be achieved by decreasing the output power. In some examples, the laser can be operated such that the output power is can be based on the requirements needed for the system or application in which the laser is employed. As illustrated in FIG. 7E, by operating the laser with conditions such that the system optical power requirement 711 is met but the requirements are not substantially exceeded, a larger tuning range or wavelength shift can be achieved compared to the tuning range when operating the laser above system requirements. For example, trace gas detection system (discussed above and illustrated in FIG. 1) located in a user's garage can be configured such that a detected carbon monoxide level less than 400 ppm is within a safe level. The system requirement can be defined by the operating conditions which 400 ppm of carbon monoxide is detected. The laser associated with the trace gas detection system (such as laser 114 illustrated in FIG. 1) can then operate at a value such that the system requirement is met, 400 ppm of carbon monoxide is detected, and a wider tuning range is achieved (than operating the laser such that the system requirements are exceeded). In some examples, the value can be equal to system operation at 1-10% above system requirements.

In some examples, the amount of phase that differs between tuning current 702, laser injection current 704, and wavelength shift 706 can depend on the frequency of modulation. In some examples, the phase difference between the laser injection current 704 and the wavelength shift 706 can be 0° or 180°. Although the disclosure includes thermal heating as a tuning mechanism, examples of the disclosure can include, and are not limited to, other tuning mechanisms such as carrier concentration modulation.

FIG. 7F illustrates exemplary non-sinusoidally modulated drive waveforms applied to the electrodes of the laser according to examples of the disclosure. As shown in the figure, the tuning current 712 can be modulated, but unlike the tuning current 702 of FIG. 7A, tuning current 712 can be non-sinusoidal in order to correct for nonlinearities and thermal time constants, such as the nonlinearities and thermal time constants discussed above. Additionally, laser injection current 714 can be non-sinusoidal. The results can be a sinusoidally varying output wavelength and an output power that is constant.

Figure 7G:
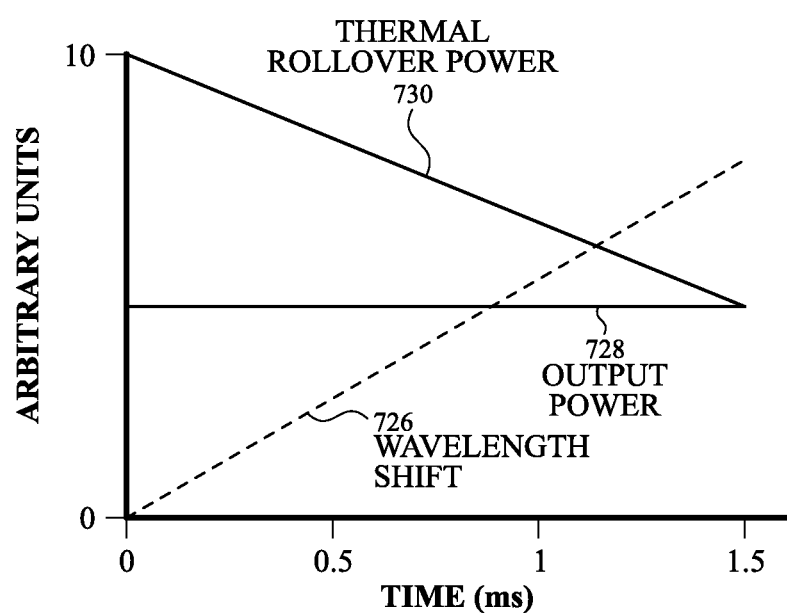
FIG. 7G illustrates an exemplary linear ramp of the emission wavelength with a constant output power below a thermal rollover power from a laser according to examples of the disclosure.

FIG. 7G illustrates an exemplary linear ramp of the emission wavelength with a constant output power below a thermal rollover power from a laser according to examples of the disclosure. This example also shows that the emission wavelength can be tuned without affecting the output power of the laser. Linearly tuning the laser while achieving a constant output power that is less than the thermal rollover power 730 can be useful for applications such as direct absorption spectroscopy.

Figure 7H:
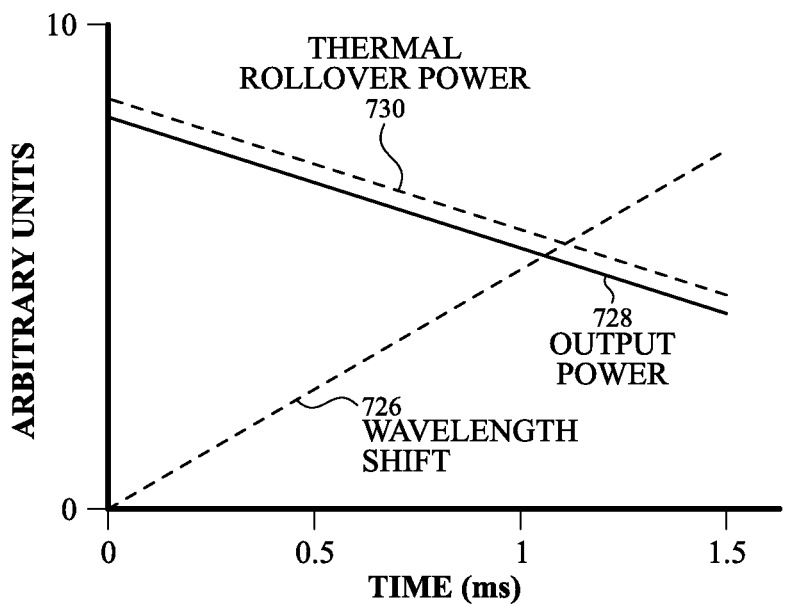
FIG. 7H illustrates an exemplary linear ramp of the emission wavelength and an output power at or near the thermal rollover power according to the examples of the disclosure.

In some examples, the laser can be operated such that the output power waveform has the same shape as the thermal rollover power, as illustrated in FIG. 7H. FIG. 7H illustrates an exemplary linear ramp of the emission wavelength with an output power close to the thermal rollover power according to the examples of the disclosure. The laser can be operated at conditions such that the output power 728 is substantially equal to the thermal rollover power 730 while linearly changing the wavelength shift 726. Such a linear change in emission wavelength can be useful for applications such as direct absorption spectroscopy with normalization to a reference detector.

Figure 7I:
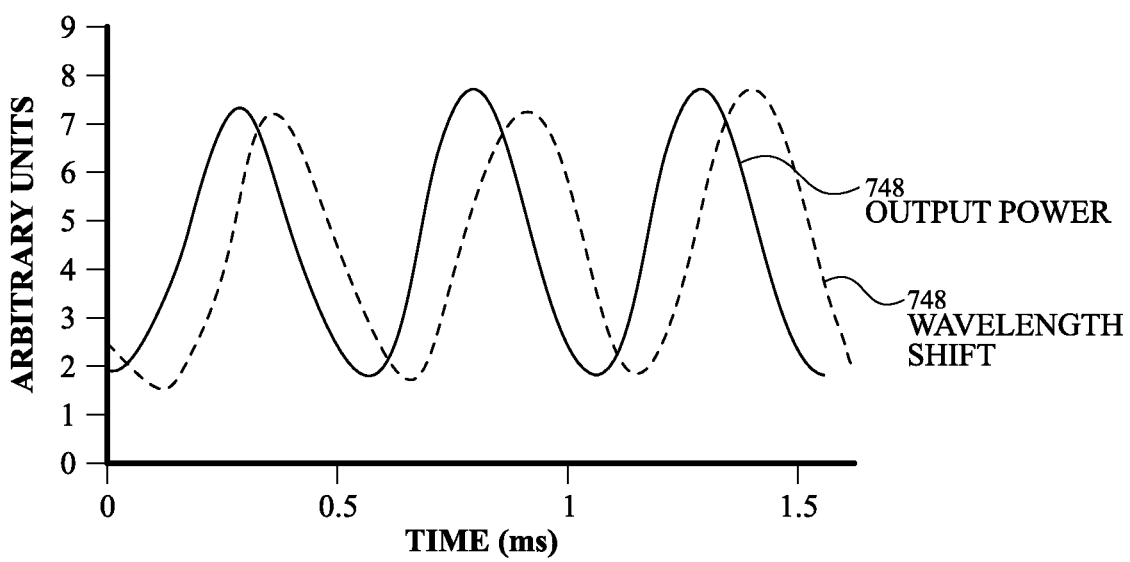
FIG. 7I illustrates exemplary variable wavelength shift and variable output power from a laser according to examples of the disclosure.

FIG. 7I illustrates exemplary variable wavelength shift and variable output power over time from a laser according to examples of the disclosure. As shown in the figure, both output power 748 and wavelength shift 746 can vary sinusoidally. In some examples, output power 748 and wavelength shift 746 can both vary at non-harmonically related frequencies. Simultaneous sinusoidal modulation of both output power and emission wavelength can be useful for applications such as wavelength modulation spectroscopy.

One skilled in the art would understand that the exemplary figures described above can represent targeted waveforms. In some examples, the resulting output waveforms can differ from the targeted waveforms due to nonlinearities (not shown).

Figure 8A:
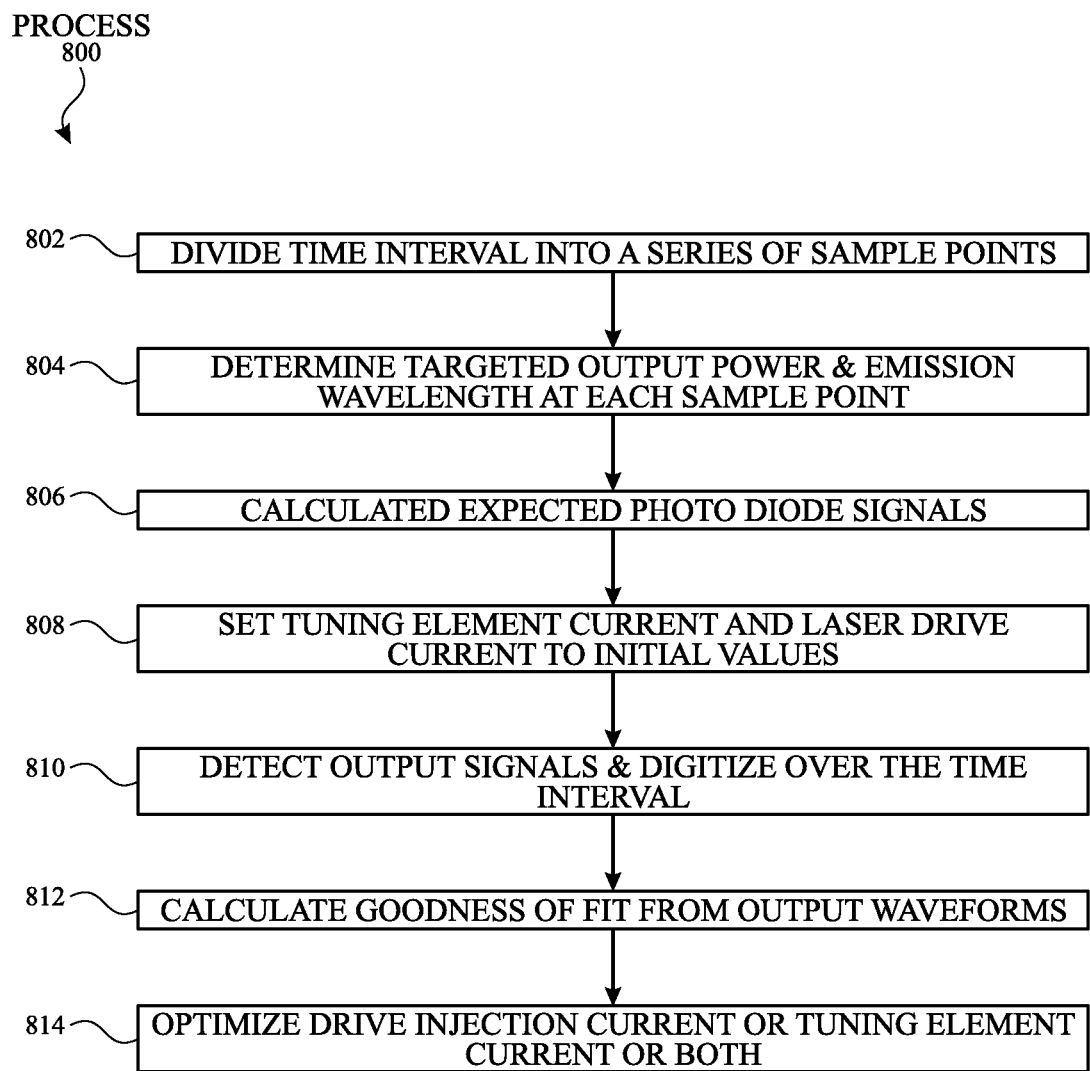
FIGS. 8A-8B illustrate exemplary process flows for optimizing the injection current and tuning element current according to examples of the disclosure.
Figure 8B:
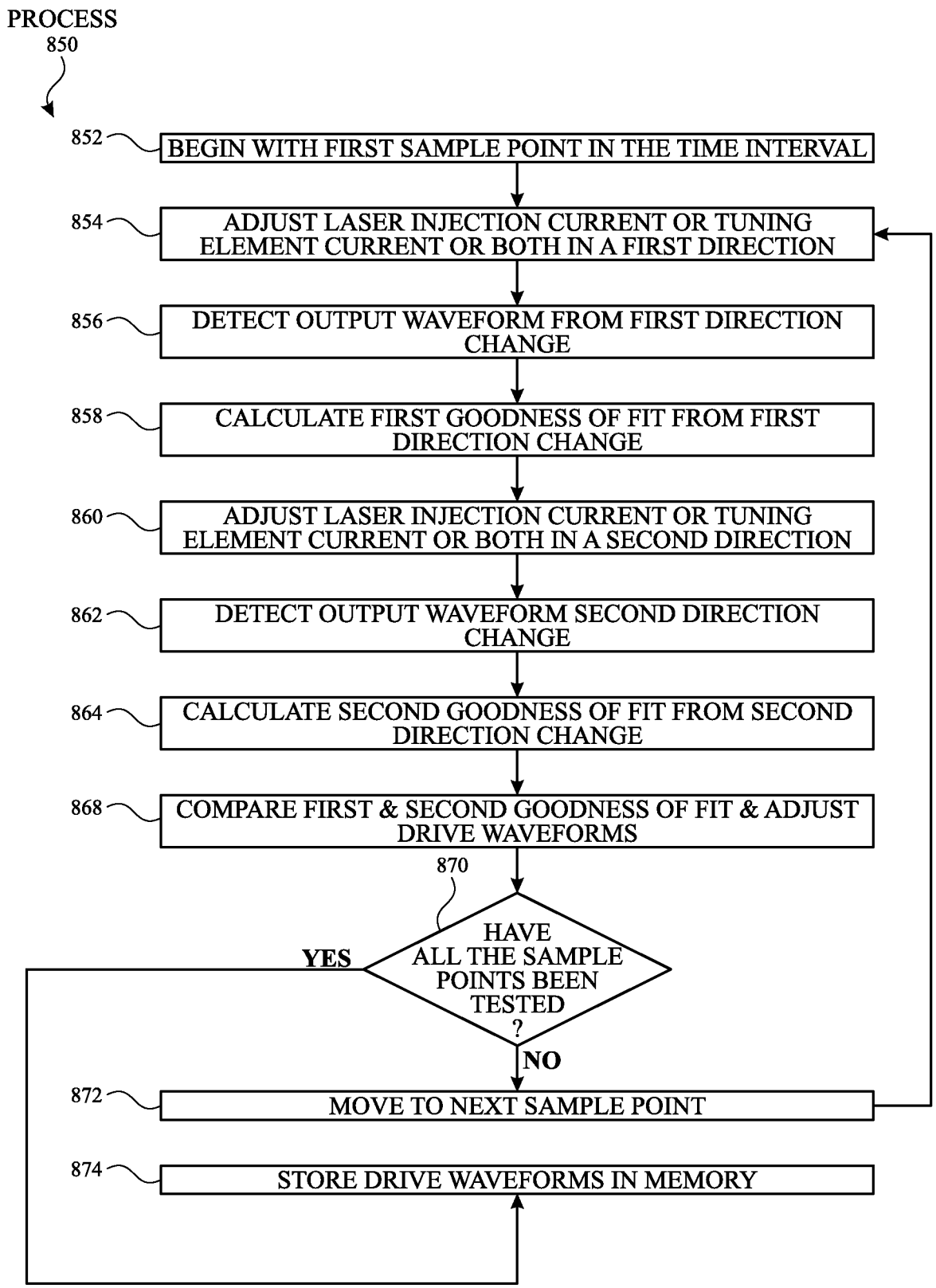

FIGS. 8A-8B illustrate exemplary process flows for optimizing the injection current and tuning element current according to examples of the disclosure. Process 800 can begin with dividing a time interval into a series of sample points (step 802). In some examples, process 800 can be performed by a processor or controller (such as controller 650 of FIG. 6). In some examples, the time interval can be based on a repetition period of the desired power and wavelength response waveforms. The controller can determine the target output power and emission wavelength at each sample point (step 804) and from this, can calculate the expected photodiode signals (step 806). The expected photodiode signals can be based on factors such as the response curves of the photodiode, the length of the etalon, the optical properties of the etalon, the response of the spectrometer, or any combination.

The controller can set the tuning element current and laser drive current to initial values (step 808). In some examples, the tuning element can be set to zero, and the laser drive current can be set to a constant value above threshold (i.e., value that the laser is turned on). Alternatively, the laser can be driven using pre-determined waveforms. In some examples, the pre-determined waveforms can be based on previous characterization data from the laser. The pre-determined waveforms can include, but are not limited to, light IV curves for different injection currents and tuning element currents and step responses of injection current perturbations. The controller or a signal acquisition system can detect the output signals and digitize over the time interval (step 810). In some examples, the time interval can be one time interval. In some examples, the output signals can be signals measured from the detectors, such as detectors 644 and 646 of FIG. 6.

From the output signals or waveforms, the goodness of fit can be calculated (step 812). The goodness of fit (GOF) can be a figure of merit to quantify the difference between the targeted and measured laser outputs or waveforms, including the output powers and emission wavelengths. For example, the GOF can be defined as:

$$GOF = E f_{i=1}^{P} w_1 x (W(t) - W_T(t))^2 + w_2 x (P(t) - PT(t))^2 \quad (1)$$

where $W(t)$ is the measured wavelength at time t, $W_T(t)$ is the targeted wavelength at time t, $P(t)$ is the measured output power at time t, $P_T(t)$ is the targeted output power at time t, $w_i$ and $w_2$ are weighted values, and P is the number of sample points in the time interval.

The controller can optimize the drive injection current or tuning element current or both (step 814). Process 850 of FIG. 8B illustrates an exemplary flow diagram of optimizing the drive injection current or tuning element current. The controller can begin with the first sample point in the time interval (step 852). The controller can change the laser injection current or tuning element current or both in a first direction (step 854), and then detect the output waveform (step 856) and calculate the first GOF (step 856) from the change in the first direction. The controller can also change the laser injection current or tuning element current or both in a second direction (step 860), and then detect the output waveform (step 862) and calculate the second GOF (step 864) from the change in the second direction. In some examples, the first direction can be opposite the second direction. For example, the first direction can be one step size higher in value and the second direction can be one step size lower in value than the injection current set in step 808 of FIG. 8A. In step 868, the first GOF and second GOF can be compared. Based on which GOF has the lowest value (compared to the other GOF) or deviation from a predetermined or targeted GOF, the drive waveforms can be adjusted.

The controller can determine if all of the sample points have been tested (step 870). If not, the controller can move to the next sample point (step 872) and repeat the adjustment process for that next sample point. If all sample points have been tested, the drive waveforms can be stored in memory (step 874).

In some examples, processes 800 and 850 can be repeated until a certain GOF value is achieved. In some examples, processes 800 and 850 can run continuously or at incremental periods while the laser is operating to actively correct for any drift in the source properties over time.

One or more of the functions described above can be performed, for example, by firmware stored in memory and executed by a processor or controller (such as controller 650 of FIG. 6). The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus, or device, a portable computer diskette (magnetic), a random access memory (RAM) (magnetic), a read-only memory (ROM) (magnetic), an erasable programmable read-only memory (EPROM) (magnetic), a portable optical disc such as a CD, CD-R, CD-RW, DVD, DVD-R, or DVD-RW, or flash memory such as compact flash cards, secured digital cards, USB memory devices, memory sticks and the like. In the context of this document, a "transport medium" can be any medium that can communicate, propagate, or transport the program for use by or in connection with the instruction execution system, apparatus, or device. The transport readable medium can include, but is not limited to, an electronic, magnetic, optical, electromagnetic, or infrared wired or wireless propagation medium.

In some examples, a method of driving a laser having a tuning element and a waveguide is disclosed. The method may comprise: applying a first waveform to the tuning element of the laser; applying a second waveform to the waveguide of the laser; modulating the first waveform simultaneously with modulating the second waveform, wherein an emission wavelength and an output power of the laser are independently controllable. Additionally or alternatively to one or more examples disclosed above, in other examples, the first waveform is different from the second waveform. Additionally or alternatively to one or more examples disclosed above, in other examples, the method further comprises modulating first and second waveforms at non-harmonic frequencies. Additionally or alternatively to one or more examples disclosed above, in other examples, at least one of the first waveform and the second waveform is sinusoidal. Additionally or alternatively to one or more examples disclosed above, in other examples, at least one of the first waveform and the second waveform is non-sinusoidal. Additionally or alternatively to one or more examples disclosed above, in other examples, the method further comprises modulating the first and second waveforms to vary the emission wavelength sinusoidally. Additionally or alternatively to one or more examples disclosed above, in other examples, the method further comprises modulating the first and second waveforms to maintain the output power at a constant value. Additionally or alternatively to one or more examples disclosed above, in other examples, wherein the laser is included in a system with a requirement the method further comprises modulating the second waveform such that the system is operating at the requirement. Additionally or alternatively to one or more examples disclosed above, in other examples, the method further comprises modulating the second waveform such that a derivative of the output power to an injection current is zero. Additionally or alternatively to one or more examples disclosed above, in other examples, the method further comprises modulating the first and second waveforms such that the output power varies at least in part sinusoidally. Additionally or alternatively to one or more examples disclosed above, in other examples, the second waveform includes a 0° or 180° phase shift from the emission wavelength. Additionally or alternatively to one or more examples disclosed above, in other examples, the method further comprises modulating the first and second waveforms such that the emission wavelength is constant or varies linearly. Additionally or alternatively to one or more examples disclosed above, in other examples, the method further comprises modulating the first and second waveforms such that a derivative of the output power to injection current is zero. Additionally or alternatively to one or more examples disclosed above, in other examples, the method further comprises modulating the first and second waveforms such that the emission wavelength varies linearly and the output power is constant. Additionally or alternatively to one or more examples disclosed above, in other examples, the method further comprises modulating the first and second waveforms such that the emission wavelength is constant and the output power varies sinusoidally. Additionally or alternatively to one or more examples disclosed above, in other examples, the method further comprises: detecting the emission wavelength; detecting the output power; determining a first difference between the detected emission wavelength and a targeted wavelength; determining a second difference between the output power and a targeted power; and adjusting at least one of the first and second waveforms to reduce at least one of the first difference and the second difference.

In some examples, a non-transitory computer readable storage medium is disclosed. The non-transitory computer readable storage medium may store one or more programs, the one or more programs comprising instructions, which when executed by a device, cause the device to perform a method comprising: applying a first waveform to a first electrode of a laser, wherein the first electrode is coupled to a tuning element of the laser; applying a second waveform to a second electrode of the laser, wherein the second electrode is coupled to a waveguide of the laser; and modulating the first waveform simultaneously with modulating the second waveform.

In some examples, a device is disclosed. The device may comprise: a laser including a first electrode and a second electrode, wherein the first electrode is driven by a first waveform and the second electrode is driven by a second waveform; and logic configured to modulate the first and second waveforms simultaneously, wherein at least one of an emission wavelength and an output power of the laser are based on the simultaneous modulation of the first and second waveforms. Additionally or alternatively to one or more examples disclosed above, in other examples, a tuning range of the laser is at least 0.2% of a center wavelength of the laser. Additionally or alternatively to one or more examples disclosed above, in other examples, the laser is a Distributed Feedback (DFB) or a Distributed Bragg Reflector (DBR) laser. Additionally or alternatively to one or more examples disclosed above, in other examples, the laser is a quantum cascade laser (QCL), interband cascade laser (ICL), or type-I laser. Additionally or alternatively to one or more examples disclosed above, in other examples, the first electrode forms a portion of a tuning element and the second electrode forms a portion of a laser structure, the tuning element thermally coupled to the laser structure.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A method of driving a semiconductor laser, comprising:
applying a laser injection current to the semiconductor laser to generate a laser output power targeting a predetermined output power;
applying a tuning current to a tuning element to generate a laser emission wavelength targeting a predetermined laser emission wavelength; wherein the semiconductor laser and the tuning element are configured to control the laser emission wavelength and the laser output power of the semiconductor laser independently of one another; and
tuning the laser emission wavelength within a predetermined tuning range while maintaining an approximately consistent laser output power, when the laser injection current exceeds a laser threshold current,
wherein the laser output power is less than a thermal rollover power for a given tuning range.

2. The method of claim 1, further comprising:
varying the laser injection current while maintaining an approximately consistent submount temperature such that the laser output power is linearly dependent on the laser injection current.

3. The method of claim 2, wherein the laser output power is linearly dependent on the laser injection current when the laser injection current exceeds a laser threshold current.

4. The method of claim 3, further comprising:
determining a laser slope efficiency based at least in part on the linear dependence of the laser output power on the laser injection current when the laser injection current exceeds the laser threshold current.

5. The method of claim 1, further comprising:
varying the tuning current to tune the laser emission wavelength while maintaining an approximately constant laser output power.

6. The method of claim 1, further comprising:
varying a laser drive power while maintaining an approximately consistent submount temperature such that the laser emission wavelength is linearly dependent on the laser drive power.

7. The method of claim 6, wherein the laser emission wavelength shifts to a lower laser emission wavelength when the laser drive power increases.

8. The method of claim 1, further comprising:
varying a tuning element drive power while maintaining an approximately consistent laser injection current such that the laser output power is linearly dependent on the tuning element drive power.

9. The method of claim 8, wherein the laser output power decreases as the tuning element drive power increases.

10. The method of claim 1, further comprising:
varying a tuning element drive power while maintaining an approximately consistent laser injection current such that the laser emission wavelength is linearly dependent on the tuning element drive power.

11. The method of claim 1, further comprising:
applying a non-sinusoidally modulated laser injection current while maintaining an approximately consistent laser output power, such that the laser output wavelength varies at least in part sinusoidally.

12. The method of claim 1, wherein an amount of phase difference between the tuning current, the laser injection current, and a wavelength shift depends primarily on a modulation frequency of the tuning current.

13. An optical device, comprising:
a semiconductor laser comprising:
a laser structure; and
a tuning structure;
logic configured to simultaneously apply a laser injection current to the laser structure and a tuning current to the tuning structure to control at least one of a laser emission wavelength or a laser output power independently of one another, wherein an amount of phase difference between the tuning current, the laser injection current, and a laser emission wavelength shift depends primarily on a modulation frequency of the tuning current.

14. The optical device of claim 13, wherein the laser structure is thermally coupled to the tuning structure.

15. The optical device of claim 13, wherein the tuning structure is configured to generate heat to control a gain of the semiconductor laser.

16. The optical device of claim 13, wherein the semiconductor laser is at least one of a Distributed Bragg Reflector (DBR) laser, a quantum cascade laser (QCL), an interband cascade laser (ICL), or a type-I laser.

17. A method of driving a tunable semiconductor laser with a tuning element, comprising:
modulating a laser injection current to a laser to generate a laser output power and a laser emission wavelength;
modulating a tuning current to the tuning element at approximately the same time as modulating the laser injection current to produce a wider laser emission wavelength tuning range, wherein the laser output power and the laser emission wavelength are independently controllable;
varying a tuning element drive power while maintaining an approximately consistent laser injection current such that the laser output power is linearly dependent on the tuning element drive power, wherein the laser output power decreases as the tuning element drive power increases.

18. The method of claim 17, further comprising:
comparing a predetermined laser output power with a measured laser output power based at least in part on a goodness of fit value and a tuning element drive waveform;
adjusting at least one of the laser injection current or the tuning element drive waveform based at least in part on the compared predetermined laser output power and an actual laser output power to target the predetermined laser output power.

* * * * *